United States Patent [19]

Nawa et al.

[11] 4,138,690

[45] Feb. 6, 1979

[54] DARLINGTON CIRCUIT SEMICONDUCTOR DEVICE

[75] Inventors: Keiji Nawa; Masami Iwasaki, both of Kawasaki, Japan

[73] Assignee: Tokyo Shibaura Electric Co., Ltd., Kawasaki, Japan

[21] Appl. No.: 795,436

[22] Filed: May 10, 1977

[30] Foreign Application Priority Data

May 11, 1976 [JP] Japan .................................. 51-58409

[51] Int. Cl.² ........................ H01L 27/02; H03K 3/26
[52] U.S. Cl. ........................................ 357/46; 307/315
[58] Field of Search ........................... 357/46; 307/315

[56] References Cited

U.S. PATENT DOCUMENTS

| 3,453,505 | 7/1969 | Offner et al. | 357/46 |
| 3,466,467 | 9/1969 | Houcke et al. | 307/315 |
| 3,596,150 | 7/1971 | Berthold | 357/46 |
| 3,648,060 | 3/1972 | Hagen | 307/315 |

Primary Examiner—Andrew J. James
Attorney, Agent, or Firm—Finnegan, Henderson, Farabow & Garrett

[57] ABSTRACT

A semiconductor device comprises darlington-connected first and second transistors, a diode connected between the emitter of the first transistor and the base of the second transistor and a resistor connected in parallel to the diode — all being formed in a single semiconductor body

12 Claims, 12 Drawing Figures

F I G. 1
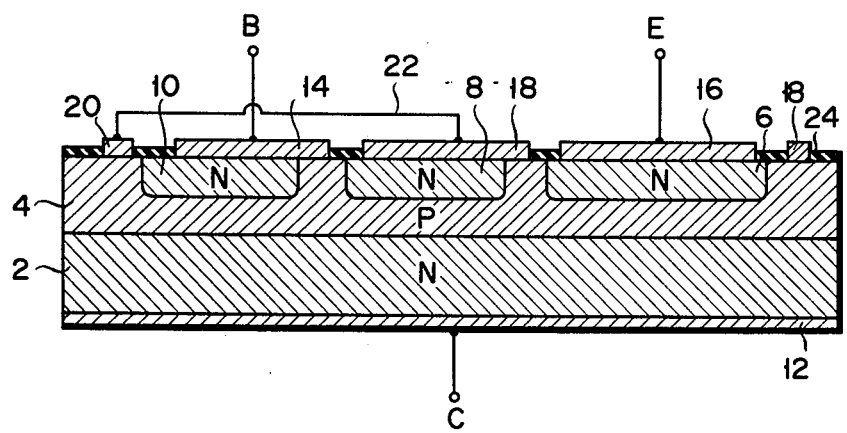
F I G. 2
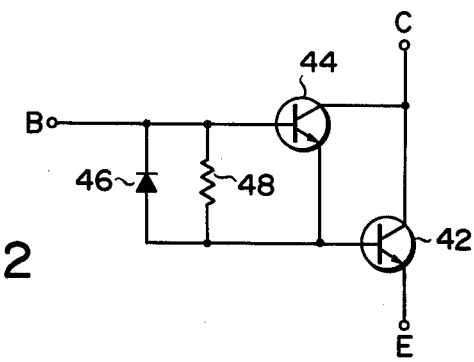
F I G. 3
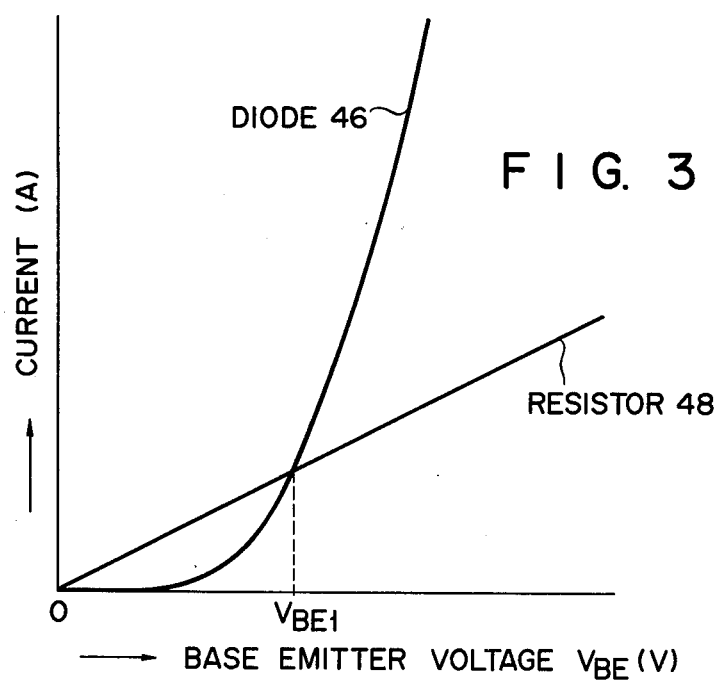

DARLINGTON CIRCUIT SEMICONDUCTOR DEVICE

BACKGROUND OF THE INVENTION

This invention relates to a semiconductor device with an improved switching characteristic.

Widely used hitherto as a switching circuit is the so-called semiconductor darlington connected circuit which comprises two transistors formed in a semiconductor wafer, one having its collector and emitter connected to the collector and base of the other, respectively. What is demanded of a switching circuit is a good switching characteristic, of course. The darlington connected circuit, however, has a poor switching characteristic. That is, its switching time is long. The poor switching characteristic of the darlington connected circuit makes a decisive defect in case the circuit is employed in a converter, inverter or switching regulator wherein a switching operation is conducted in an audible frequency band of more than 20KHz.

To improve the switching characteristic of a semiconductor darlington connected circuit, there has been invented a semiconductor device wherein a diode is connected between the base of a first transistor and the emitter of a second transistor. The diode makes the base current flow in the reverse direction when the first and second transistors are switched off. Thus the switching time period of the semiconductor device becomes shorter. The diode is generally soldered either to the electrodes formed on the semiconductor wafer of the device or to the external terminal pins of the device. During the soldering process the molten solder may flow to unnecessary areas of the semiconductor wafer surface, thereby affecting the switching characteristic of the device. Moreover, the soldering iron may scratch and damage the electrodes and wires formed on the semiconductor wafer. Further, if the diode is fitted to the external terminal pins, it needs a member which surrounds and protects it. In this case, the member helps elevate the cost of the device. Still further, the lead wire for fitting the diode has inductance, though very small (usually about $0.01\mu H$), and adversely serves to lengthen the switching time period of the device.

SUMMARY OF THE INVENTION

An object of this invention is to provide a semiconductor device which comprises a semiconductor darlington connected circuit and which has an improved switching characteristic.

The semiconductor device according to this invention comprises a semiconductor body, first and second transistors darlington-connected and formed in the semiconductor body, and diode and resistor means both formed in the semiconductor body. The collector and base of the first transistor are connected to the collector and emitter of said second transistor, respectively, while the anode and cathode of the diode means are connected to the base of the first transistor and the base of the second transistor, respectively. The resistor means is connected in parallel to the diode means.

BRIEF DESCRIPTION OF THE DRAWINGS

FIG. 1 shows one embodiment of the semiconductor device according to this invention;

FIG. 2 is a circuit diagram of the equivalent circuit of device shown in FIG. 1;

FIG. 3 shows the current characteristics of the diode 46 and the resistor 48 of the circuit shown in FIG. 2;

DETAILED DESCRIPTION OF THE PREFERRED EMBODIMENTS

Figure 4:
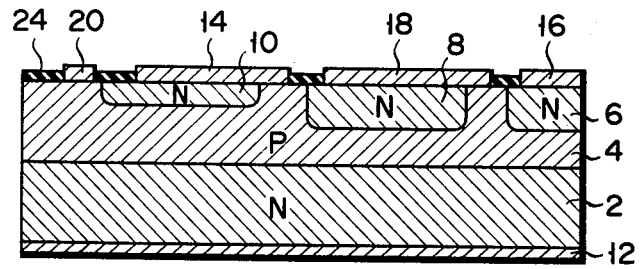
FIG. 4 to 7 show modifications of the device shown in FIG. 1.

The device shown in FIG. 1 comprises a first NPN transistor, a second NPN transistor, a diode and a resistor. The first NPN transistor is constituted by an N semiconductor layer 2, a P semiconductor layer 4 and a first N semiconductor region 6. The second NPN transistor is constituted by the N semiconductor layer 2, the P semiconductor layer 4 and a second N semiconductor region 8. The diode is constituted by the P semiconductor layer 4 and a third N semiconductor region 10. On the exposed surface of the N semiconductor layer 2 there is formed a collector electrode 12. A base electrode 14 is formed partly on the third N semiconductor region 10 and partly on the P layer 4, and an emitter electrode 16 on the first N semiconductor region 6. Partly on the second N semiconductor region 8 and partly on the P semiconductor layer 4 there is formed a first auxiliary base electrode 18 which consttiutes a short circuit between the P layer 4 and the second N region 8. On the P layer 4 there is formed a second auxiliary base electrode 20, which is connected to the first auxiliary base electrode 18 by, for example, a wire 22. The base electrode 14 extends on the P layer 4 toward the first N region 6. A collector terminal C, a base terminal B and an emitter terminal E are fixed to the collector electrode 12, the base electrode 14 and the emitter electrode 16, respectively. A protective oxide film 24 made of, for example, $SiO_2$ is formed on the entire surface of the P layer 4 except for the portions where the electrodes 14, 16, 18 and 20 are formed.

The equivalent circuit of the device is constituted by, as shown in FIG. 2, a first NPN transistor 42, a second NPN transistor 44, a diode 46 and a resistor 48. The collector and emitter of the second NPN transistor 44 are connected to the collector and base of the first NPN transistor 42, respectively. The diode 46 has its cathode connected to the base of the second transistor 44 and its anode connected to the base of the first transistor 42 and the emitter of the second transistor 44. The resistor 48 is connected in parallel to the diode 46. This means that the semiconductor device shown in FIG. 1 is constituted by such a circuit as shown in FIG. 2 formed in a semiconductor body.

In the semiconductor device of FIG. 1 the diode 46 is constituted by the PN junction between the P layer 4 and the third N region 10. Thus, a diode need not be soldered to the P layer 4. Any measure need not be taken to prevent molten solder from flowing to unnecessary areas of the surface of the device. Nor do the electrodes and wire on the surface of the device need to be scratched or damaged by a soldering iron. The semiconductor device can therefore possess a good switching characteristic. Further, since the diode 46 requires no protection member, the cost of the device is lower than otherwise. In addition, no lead wire is necessary for connecting the diode 46 to the device, and the switching time of the device need not be lengthened due to inductance of such a lead wire. This also serves to improve the switching characteristic of the semiconductor device.

In the semiconductor device of FIG. 1, when base current is applied to the second transistor 44 i.e. the base terminal B in FIG. 1, it may flow out through the auxiliary base electrode 20. To prevent such a current leak it is desired that the auxiliary base electrode 20 should be positioned opposite to the second N region 8 with respect to the third N region 10 and that the third N region 10 should be expanded to both sides of the device. Then, that portion of the P layer 4 which lies between the base electrode 14 and the second auxiliary base electrode 20 has a sufficiently large resistance in the sidewise direction of the device. This resistance, which is equivalent to the resistor 48 shown in FIG. 2, should be of such value as would not affect the operation of the second transistor 44 and would permit the current from the base of the first transistor 42 to flow in the reverse direction. The reason will be explained with reference to FIG. 3.

FIG. 3 shows the relationship between the base-emitter voltage $V_{BE}$ of the second transistor 44 and the foward-biased current flowing through the diode 46 and the relationship between the base-emitter voltage $V_{BE}$ and the current flowing through the resistor 48. As clearly shown in FIG. 3, the reverse current flows through the resistor 48 until the voltage $V_{BE}$ reaches $V_{BE1}$ at which an equal current flows through both the resistor 48 and the diode 46. It is also clear that the reverse current flows through the diode 46 once the voltage $V_{BE}$ has reached $V_{BE1}$. In view of this alone, it is desired that the resistor 48 should have the lowest possible resistivity. Practically, however, if the resistivity of the resistor 48 is too low, the base current supplied to the base terminal B does not flow into the base electrode of the second transistor 44, but does leak through the resistor 48. As a result, the second transistor 44 will not operated at all. This is why the resistor 44 should have such a resistivity as would permit the reverse current to flow from the base of the first transistor 42 without disenabling the second transistor 44. Such a specific resistivity may vary within a range in accordance with the operation characteristics of the transistors 42 and 44, the rectification characteristic of the diode 48 and the conditions under which the device is to be operated.

Moreover, it is preferred that the second auxiliary base electrode 20 should be positioned near the third N region 10. If the electrode 20 is so positioned, that portion of the P layer 4 which lies between the electrode 20 and the third N region 10 has a small resistance. Then, the voltage drop between the electrode 20 and the third N region 10 can be made smaller than otherwise.

Figure 5:
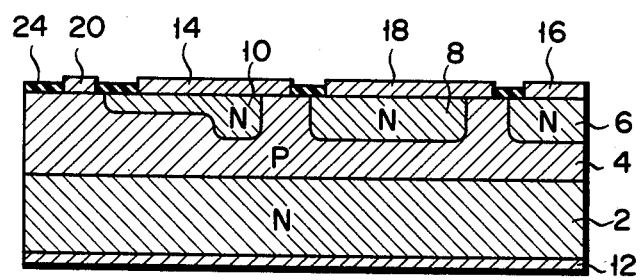
Figure 6:
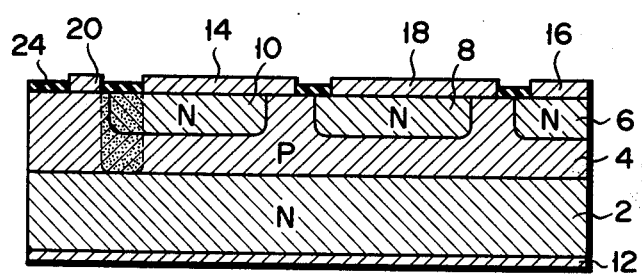
Figure 7:
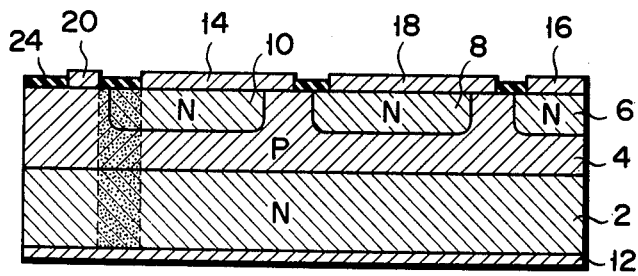

Furthermore, to prevent the collector current from flowing from the transistors 42 and 44 into the third N region 10 it is desired that the third N region 10 should be made thinner than the first and second N regions 6 and 8 as illustrated in FIG. 4. Or, to achieve the same object, only that portion of the third N region 10 which is close to the second auxiliary base electrode 20 should be made thinner than the first and second N regions 6 and 8 as shown in FIG. 5. Or, as shown in FIG. 6, a life time killer may be provided at the porton of the P layer 4 and the area portion of the third N region 10 both lie between the base electrode 14 and the second auxiliary base electrode 20. The life time killer may be formed by, for instance, diffusing gold into these portions of the P layer 4 and N region 10 or irradiating an electron beam to these portions. As shown in FIG. 7, the life time killer may be extended to the collector electrode 12 through the N layer 2. The life time killer as shown in FIG. 6 or 7 serves to shorten the life time of the carriers injected into the second auxiliary base electrode 20. The carrier life time being short, the N layer 2, the P layer 4 and the third N region 10 are prohibited from cooperating to function as a transistor.

Figure 8:
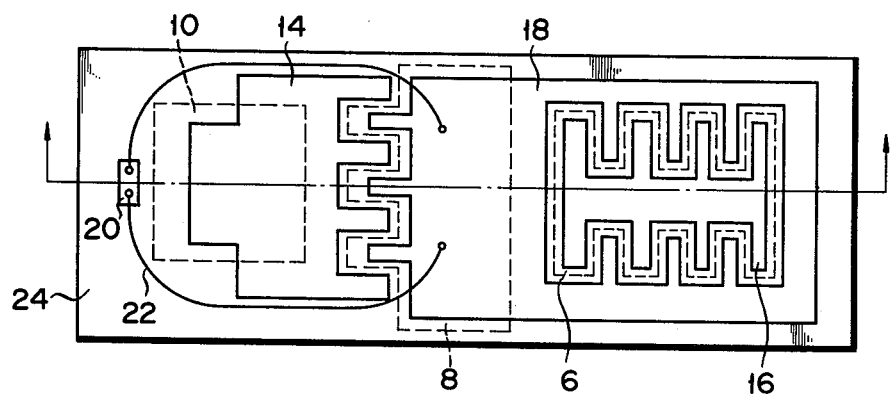
FIG. 8 is a top plan view of the device shown in FIG. 1.

As illustrated in FIG. 8, the base electrode 14, the emitter electrode 16 and the first auxiliary base electrode 18 are pectinated as viewed from above the device. Shaped like this, they have the longest possible circumference, thereby to enlarge the base current capacity and collector current capacity of the semiconductor device.

It will be explained why the switching characteristic of the device is improved by connecting the diode 46 between the first transistor 42 and the second transistor 44. In case the first transistor 42 is truned on, electrons are injected into the P layer 4 from the N layer 2. Under this condition, the first transistor 42 begins shifting to turn-off state when supplied with current in the reverse direction. Once the first transistor 42 has begun shifting to turn-off state, the electrons in the P layer 4 are not injected into the first N region 6; they remain within the P layer 4. To shorten the switching time period of the device, these electrons should be dissipated as quickly as possible.

If the diode 46 is not provided, the electrons in the P layer 4 will be discharged through between the emitter and base of the second transistor 44 and through the resistor 48 connected between the base of the first transistor 42 and the base of the second transistor 44. However, both the resistance between the emitter and base of the second transistor 44 and the resistivity of the resistor 48 are so high that the electrons cannot be discharged sufficiently fast. This is why the device is provided with the diode 46 as shown in FIG. 2. Through the diode 46 the base current can flow in the reverse direction, and thus can serve to dissipate the electrons from the P layer 4. Consequently, the switching time period of the device is made short, and the switching characteristics is improved.

Without the diode 46, the base current flowable through the P layer 4 should depend on the resistance between the emitter and base of the second transistor 44 and the resistivity of the resistor 48. But it is inevitably small since both the resistance between the emitter and base of the second transistor 44 and the resistivity of the resistor 48 are high. By contrast, the current capacity of the device is enlarged since the device is provided with the diode 46. This is because the diode is a forward direction resistor with an extremely small resistivity, through which the base current flows.

Figure 9:
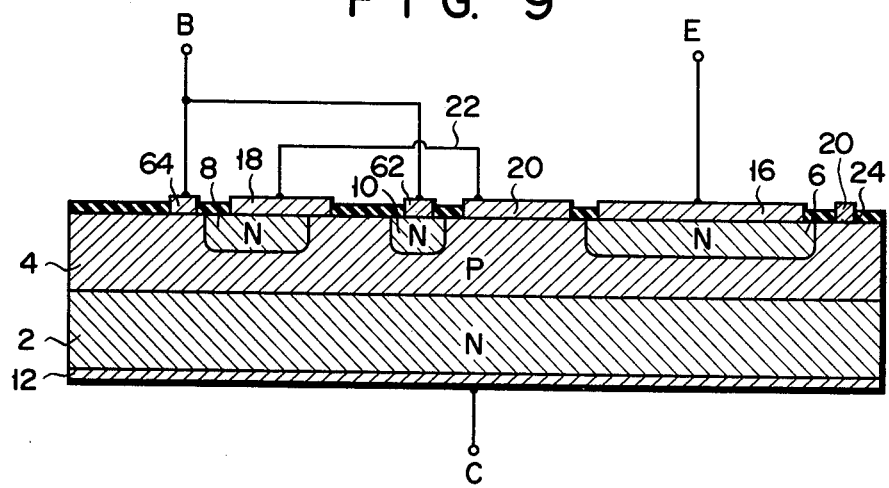
FIG. 9 shows another embodiment of the present invention.

Another embodiment of this invention shown in FIG. 9 differs from that of FIG. 1 in the following respects. First, the second N region 8 and the third N region 10 are exchanged positionally. Secondly, the second auxiliary base electrode 20 is formed between the first N region 6 and the third N region 10. Thirdly, there are formed a first base electrode portion 62 on the third N region 10 and a second base electrode portion 64 on that portion of the P layer 4 which is opposite to the third N region 10 with respect to the second N region 8, and these base electrode portions 62 and 64 correspond to the base electrode 14 of the device shown in FIG. 1. In the device the first auxiliary base electrode 18 and the second auxiliary base electrode 20 are connected by a connection member 22. The connection member 22 is practically a vapor-deposited metal layer, though it is depicted as if a wire in FIG. 9.

Figure 10:
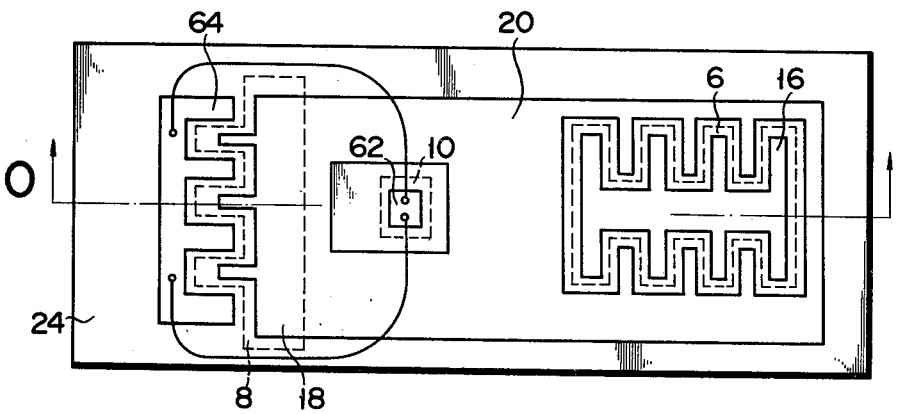
FIG. 10 is a top plan view of the device shown in FIG. 9.

The equivalent circuit of this device can be shown also as illustrated in FIG. 2. The device therefore has the same effects as possible with the device shown in FIG. 1. It has such a top plan view as shown in FIG. 10. The emitter electrode 16, base electrode 18, second base electrode portion 64 are pectinated for the same reason as in the device of FIG. 1. That is, the electrodes 16 and 18 and the second base electrode portion 64 are so shaped as to enlarge the collector current capacity and base current capacity.

Figure 11:
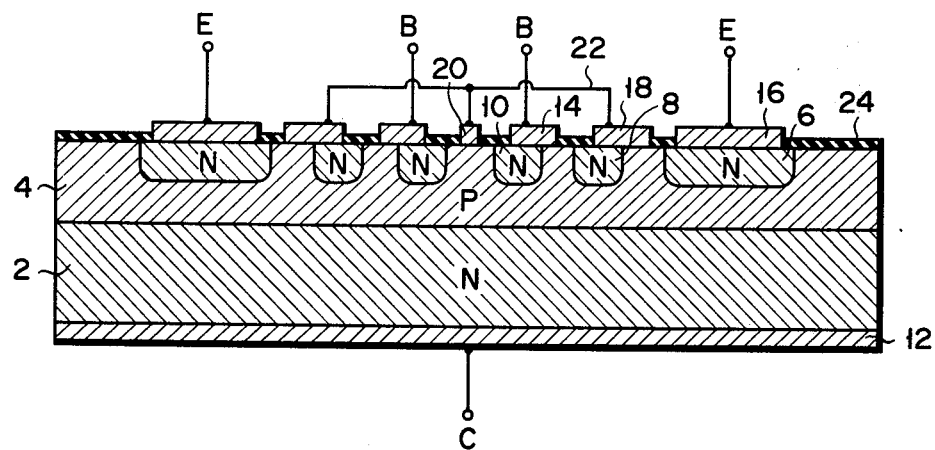
FIG. 11 shows a further embodiment of the present invention.
Figure 12:
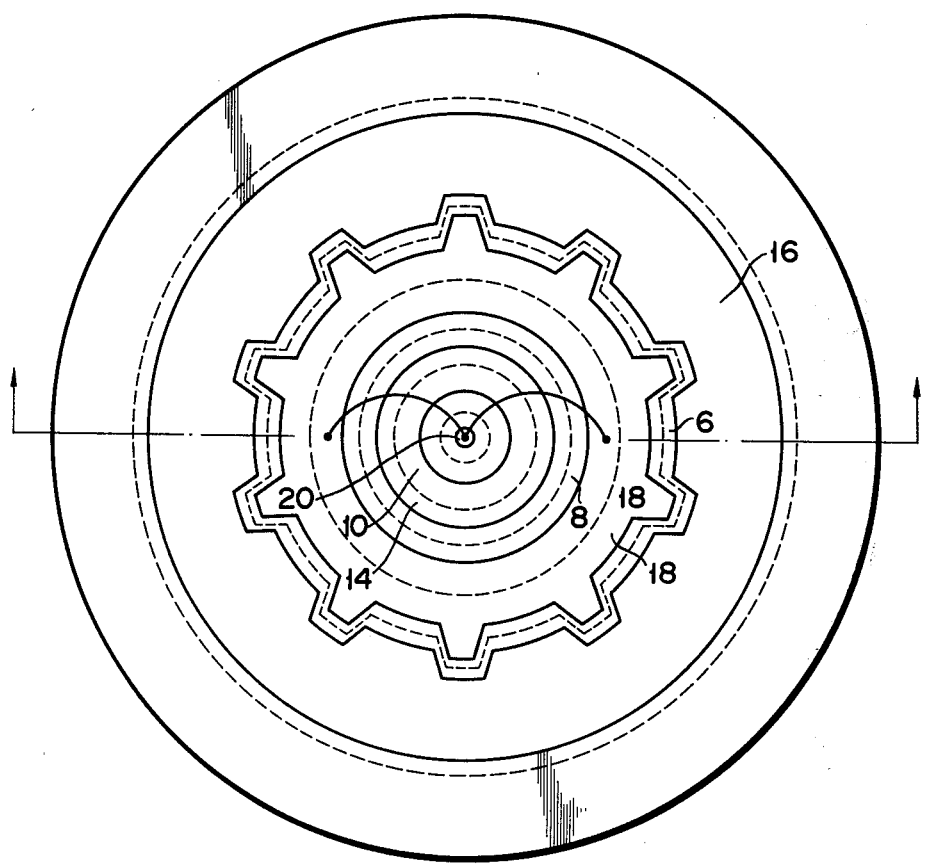
FIG. 12 is a top plan view of the device shown in FIG. 11.

Still another embodiment of this invention shown in FIG. 11 differs from that of FIG. 1 in that its third N region 10 is shaped like a ring to surround the second auxiliary base electrode 20, its second N region 8 is shaped like a ring to surround the third N region 10, and its first N region 6 is shaped like a ring to surround the second N region 8. This device has such a top plan view as shown in FIG. 12. As evidently shown in FIG. 12, the device is disc-shaped as a whole. It achieves the same effects as possible with the device of FIG. 1. Its first auxiliary base electrode 18 and emitter electrode 16 are both pectinated for the same reason as in the device of FIG. 1. That is, these electrodes 18 and 16 are so shaped as to enlarge the collector current capacity and base current capacity. Also in this device it is desired that the second auxiliary base electrode 20 should be disposed near the third N region 10 for the same reason as in the device shown in FIG. 1.

In the device of FIG. 11, the second auxiliary base electrode 20 is maintained at the same potential as the first base electrode 18. Further, the first auxiliary base electrode 18 is formed between the first N region 6 and the third N region 10. As a result, the transistor 42 can be operated with a higher efficiency than otherwise.

All the embodiment of this invention thus far mentioned can be practically operable if the conductivity type of each semiconductor layer or region is changed to the opposite one.

What is claimed is:

1. A Darlington circuit semiconductor device comprising a semiconductor body, first and second transistors darlington-connected and formed in said semiconductor body, diode means formed in said semiconductor body to permit, when said first and second transistors are switched off, a base current of said first transistor to flow in the reverse direction to enhance a switching speed of said first and second transistors, and resistor means formed in said semiconductor body, the collector and base of said first transistor being connected to the collector and emitter of said second transistor, respectively, said resistor means being connected in parallel to said diode means, and the anode and cathode of said diode means being connected to the base of said first transistor and the base of said second transistor, respectively.

2. A Darlington circuit semiconductor device comprising a semiconductor body; a first layer of one conductivity type formed in said semiconductor body; a second layer of the opposite conductivity type formed in said semiconductor body and forming a PN junction jointly with said first layer; first, second and third regions of said one conductivity type being formed in said second layer, forming PN junctions jointly with said second layer and having exposed surfaces; a collector electrode provided on said first layer; an emitter electrode provided on the exposed surface of said first region; a first base electrode provided on the exposed surface of said second region; a second base electrode provided on said second layer and electrically connected to said first base electrode; a third base electrode provided on the exposed surface of said third region; a fourth base electrode provided on said second layer and electrically connected to said third base electrode; and a fifth base electrode provided on said second layer and electrically connected to said first and second base electrodes.

3. A Darlington circuit semiconductor device according to claim 2, wherein that portion of said second layer which lies between said fourth and fifth base electrodes functions as resistance.

4. A Darlington circuit semiconductor device according to claim 2, wherein said fifth base electrode is opposite to said second region with respect to said third region.

5. A Darlington circuit semiconductor device according to claim 4, wherein said fifth base electrode is located near said third region.

6. A Darlington circuit semiconductor device according to claim 4, wherein said third region is made thinner than said first and second regions.

7. A Darlington circuit semiconductor device according to claim 4, wherein said third region is made thin at the portion adjacent to said fifth base electrode.

8. A Darlington circuit semiconductor device according to claim 4, wherein those portions of said second layer and third region which lie between said third and fifth base electrodes are doped with a life time killer.

9. A Darlington circuit semiconductor device according to claim 4, wherein those portions of said first and second layers and said third region which lie between said third and fifth base electrodes are doped with a life time killer.

10. A Darlington circuit semiconductor device according to claim 2, wherein said first and third region sandwich said second region, said second base electrode is a portion of said first base electrode which extends toward said first region, said fourth base electrode is a portion of said third base electrode which extends toward said second region, and said fifth base electrode is opposite to said second region with respect to said third region and is electrically connected to said first base electrode though conductive means.

11. A Darlington circuit semiconductor device according to claim 2, wherein said fifth base electrode is located in the center of the device in the direction of depth, said third and fourth base electrodes surround said fifth base electrode in a ring form, said first and second base electrodes surround said third and fourth electrodes substantially in a ring form, said first electrode has on its outer periphery a plurality of projections spaced at equal distance, said emitter electrode surrounds said first and second base electrodes substantially in a ring form and has on its inner periphery a plurality of concaves which conform to said projections.

12. A Darlington circuit semiconductor device according to claim 2, wherein said first and second regions sandwich said third region, said second base electrode is a portion of said first base electrode which extends toward said third region, said fourth base electrode is opposite to said third region with respect to said second region and is electrically connected to said third base electrode through first conductive means, and said fifth base electrode is located between said first and third regions and is electrically connected to said first base electrode through second conductive means.

* * * * *